US008259516B2

(12) United States Patent
Tsumura

(10) Patent No.: US 8,259,516 B2
(45) Date of Patent: Sep. 4, 2012

(54) MEMORY CIRCUIT INCLUDING ROW AND COLUMN SELECTION FOR WRITING INFORMATION

(75) Inventor: Kazuhiro Tsumura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 105 days.

(21) Appl. No.: 12/701,144

(22) Filed: Feb. 5, 2010

(65) Prior Publication Data

US 2010/0208532 A1  Aug. 19, 2010

(30) Foreign Application Priority Data

Feb. 13, 2009  (JP) ................................. 2009-031380

(51) Int. Cl.
*G11C 7/00* (2006.01)
*G11C 7/22* (2006.01)
(52) U.S. Cl. ................................. 365/189.16; 365/210.1
(58) Field of Classification Search ............. 365/189.16, 365/210.1
See application file for complete search history.

(56) References Cited

U.S. PATENT DOCUMENTS 7,457,178 B2 * 11/2008 Tu et al. ......................... 365/201
7,864,590 B2 * 1/2011 Kim et al. ................. 365/185.22
2006/0133155 A1 * 6/2006 Fujita et al. ............... 365/185.29

FOREIGN PATENT DOCUMENTS

JP           06-037254 A       2/1994
JP        2003-110029 A        4/2003

* cited by examiner

*Primary Examiner* — Hoai V Ho
*Assistant Examiner* — Kretelia Graham
(74) *Attorney, Agent, or Firm* — Brinks Hofer Gilson & Lione

(57) ABSTRACT

Provided is a memory circuit including: memory cells (A) arranged in columns and rows; memory cells (B) each provided for each of the rows for storing information indicative of whether writing into the memory cells (A) of the each of the rows has been completed or not; and a circuit for selecting one of the rows by utilizing the information stored in the memory cells (B). The memory circuit writes information into the memory cell (B) upon completion of writing into the memory cells (A) of a given one of the rows. By utilizing a change in the information stored in the memory cell (B), the given one of the rows is switched from a selected state to a non-selected state, and a next row is switched from the non-selected state to the selected state so that writing is enabled. The operation is repeated to thereby sequentially select a row to be written.

12 Claims, 9 Drawing Sheets

| Data | Divided voltage (V) | | | | | | Output from Comparator | Output from NAND |
|---|---|---|---|---|---|---|---|---|
| Terminal Voltage (V) | 1st Col. | 2nd Col. | 3rd Col. | 4th Col. | 5th Col. | 6th Col. | (1st · · · · 6th) | (1st · · · · 6th) |
| 0.98 | 0.85 | 0.63 | 0.46 | 0.34 | 0.25 | 0.19 | (111111) | (111111) |
| 1.32 | 1.15 | 0.85 | 0.63 | 0.46 | 0.34 | 0.25 | (011111) | (011111) |
| 1.79 | 1.56 | 1.15 | 0.85 | 0.63 | 0.46 | 0.34 | (001111) | (101111) |
| 2.42 | 2.11 | 1.56 | 1.15 | 0.85 | 0.63 | 0.46 | (000111) | (110111) |
| 3.28 | 2.85 | 2.11 | 1.56 | 1.15 | 0.85 | 0.63 | (000011) | (111011) |
| 4.43 | 3.85 | 2.85 | 2.11 | 1.56 | 1.15 | 0.85 | (000001) | (111101) |
| 6.00 | 5.21 | 3.85 | 2.85 | 2.11 | 1.56 | 1.15 | (000000) | (111110) |

Resistance ratio: 1st column 0.869; 2nd column 0.642; 3rd column 0.475; 4th column 0.351; 5th column 0.259; 6th column 0.192

Resistance ratio = (Resistance between a column and Vss) / (Total resistance)

FIG. 10

MEMORY CIRCUIT INCLUDING ROW AND COLUMN SELECTION FOR WRITING INFORMATION

RELATED APPLICATIONS

This application claims priority under 35 U.S.C. §119 to Japanese Patent Application No. 2009-031380 filed on Feb. 13, 2009, the entire content of which is hereby incorporated by reference.

BACKGROUND OF THE INVENTION

1. Field of the Invention

The present invention relates to a memory circuit for writing data into a memory device, and more particularly, to a memory circuit capable of preventing erroneous writing into a memory device.

2. Description of the Related Art

First, description is given of a comparison between a fuse and a memory element that are used for trimming of analog quantity.

Most of integrated circuits (ICs) controlling analog quantity are trimmed for adjusting the analog quantity. There are some kinds of trimming method therefor. Three representative ones are described below:

(1) laser fuse method: a method in which a fuse is blown through irradiation of a laser;

(2) electrical fuse method: a method in which a fuse is blown through application of a large amount of current; and (3) memory method: a method in which information is stored in a memory element, such as an erasable programmable read-only memory (EPROM).

In a broad sense, a fuse may be regarded as a kind of one-time programmable memory. However, the fuse is not called "memory" in general, and hence is not treated as a memory in this specification. As the EPROM, there is widely used a transistor whose threshold voltage Vth varies when carriers are injected into its floating gate by means of Fowler-Nordheim (FN) tunnel current or hot carriers.

Various ways of trimming can be found, and to facilitate understanding thereof, description is given with reference to FIG. 2. FIG. 2 illustrates a circuit called voltage detector, in which an output is inverted depending on whether a power supply voltage is higher or lower than a given value. The voltage detector is widely used for the purpose of power supply voltage monitoring.

An outline of operations of the voltage detector is described. Resistive elements 7 are disposed between a power supply VDD and a ground VSS so that a potential of the power supply VDD is divided with reference to the ground VSS. A comparator compares a potential determined by the potential dividing with a reference potential, and an output level of the comparator is inverted depending on whether the potential is higher or lower than the reference potential. The output level is shaped by an amplifier to be output.

A potential value at which the output level is inverted may be changed by division ratios of resistances. Among actual products, a value of the reference potential varies due to manufacturing fluctuations. The variations may cancel out one another by adjustments to the division ratios of the resistances. Thus, when the division ratio is enabled to be adjusted to an arbitrary value, the voltage detector capable of inverting its output at a desired voltage may be obtained.

The adjustment to the division ratio is realized by the following configuration. That is, fuses 8 and the resistive elements 7 are arranged in parallel with each other, and a resistive element 7 whose corresponding fuse 8 is blown functions as a resistor, whereas a resistive element 7 whose corresponding fuse 8 is not blown does not function as a resistor because this resistive element is short-circuited by the fuse. In general, this adjustment is called trimming. The voltage detector is merely employed as an example to describe the trimming because the voltage detector allows the simplest description of the trimming. Accordingly, the trimming is not limitedly performed in the circuit described above.

The laser fuse method is a method in which a target fuse is irradiated with a laser so that the fuse is blown, to thereby perform desired trimming. This method has an advantage that there is no need to provide a circuit for selecting which of the fuses is to be cut, and an external terminal. The trimming is performed before a chip is assembled into a package because the fuse cannot be irradiated with the laser in a packaged state.

A problem of this method is that trimming may not be performed in a packaged state. Analog quantity varies during a packaging process and during a reflow process of mounting the chip onto a board. For this reason, the trimming is desired to be performed after the reflow process, whereas the trimming may not be performed in actuality because the laser irradiation cannot be performed in the packaged state. Accordingly, in many cases, taking the variations into consideration, such a specification range of characteristics is adopted that is narrower than a specification range of finally-required characteristics. As a result, there arise problems of reduced yields, an increased chip area due to an additional circuit for achieving high precision, and the like. Besides, the laser fuse method has another problem that the method cannot be applied to a product necessary to be trimmed by a product purchaser on its own.

Next, the electrical fuse method is described. The electrical fuse method is a method in which a large amount of current is caused to flow through a target fuse so that the target fuse generates heat and is blown by the heat, to thereby perform desired trimming. This method enables the trimming to be performed in a packaged state because the trimming is an electrical trimming, and hence the above-mentioned problems may be avoided.

In this method, a large amount of current necessary for electrically blowing a fuse needs to be caused to flow through the fuse, and hence an external terminal is provided for each fuse in many cases. The external terminal is called pad, and the pad generally has a dimension of approximately 100 μm by 100 μm. Thus, compared to the laser fuse method, a significantly large area is required.

In addition, in order to perform trimming in a packaged state, each of the pads needs to be connected to a pin of a package, with the result that the number of pins of the package is significantly increased. JP 06-37254 A discloses a way of solving the problem of the increased number of pads. According to the method disclosed in JP 06-37254 A, the required number of pads may be reduced to two, which produces an effect of significantly reducing the area.

However, the method disclosed in JP 06-37254 A requires a serial-to-parallel converter for converting serial data into parallel data, two pads for inputting information to the serial-to-parallel converter, and a transistor that is capable of causing a large amount of current to flow. Thus, there remains a problem that the area is still large compared to the laser fuse method.

Next, the memory method is described. The memory method is a method employing a memory element instead of a fuse, and trimming is generally performed with the following configuration. That is, as illustrated in FIG. 3, transistors 10 are disposed in parallel with the resistive elements 7, and respective gate potentials of the transistors 10 are controlled by memory cells 9. When a transistor 10 is turned OFF, a corresponding resistive element 7 functions as a resistor, whereas when a transistor 10 is turned ON, a corresponding resistive element 7 is short-circuited by the turned-ON transistor 10.

Such a non-volatile memory element as the EPROM continues to retain stored information even after its power supply has been cut off, and hence the non-volatile memory element is suitable for use in trimming.

Each of the memory cells 9 has such a configuration as illustrated in FIG. 4. The memory cell 9 includes a memory element 12 formed of an N-channel transistor having a floating gate structure. In general, writing is performed by injecting electrons into a floating gate of the N-channel transistor. When the electrons have been injected into the floating gate, a channel of the N-channel transistor is less likely to be formed, resulting in an increased threshold Vth. FIG. 5 illustrates a relation between a control gate voltage VCG and a drain current of the memory element 12. As illustrated in FIG. 5, information is stored by utilizing the fact that the threshold Vth is increased after the writing.

The trimming is performed by the writing into the memory element, and hence there require a circuit for selecting the memory element and an external terminal.

The memory method also has an advantage that the trimming may be performed after the packaging process. However, the memory method requires a serial-to-parallel converter for selecting a memory element to be trimmed, and pads for inputting a signal for the selection to the serial-to-parallel converter, similarly to the case of the electrical fuse method disclosed in JP 06-37254 A. The memory method is different from the electrical fuse method in that a large amount of current is not required and an area may be thus reduced correspondingly to a transistor for causing a large amount of current to flow. However, this merely means that the area may be reduced compared to the electrical fuse method, and hence the memory method still has a problem of an increased area compared to the laser fuse method. Besides, the memory method has another problem that each memory element needs to be provided with an erroneous write prevention function in practical use and a circuit therefor thus needs to be provided.

JP 2003-110029 A discloses a technology for attempting to solve the above-mentioned problems. As compared to the laser fuse method, the technology, however, requires at least two pads and a circuit that is unnecessary in the laser fuse method, leading to an inevitable increase in a chip area.

As described above, in order to enable trimming to be performed in a packaged state, the conventional technology requires extra pads and an extra circuit (hereinafter respectively referred to as additional pads and additional circuit), as compared to the case of the laser fuse method. As a result, there arises a problem of an increased chip size.

SUMMARY OF THE INVENTION

The present invention has been made to solve the problem described above, and it is an object thereof to provide a technology capable of reducing the number of additional pads and simplifying an additional circuit, which are required for enabling trimming to be performed in a packaged state, to thereby reduce a chip size.

In order to solve the above-mentioned problem, a memory circuit according to the present invention employs means described below.

The memory circuit writes information into a target memory cell by selecting a column and a row of the target memory cell, and includes: memory cells A that are arranged in columns and rows; memory cells B that are each provided for each of the rows, for storing information indicative of whether writing into the memory cells A of the each of the rows has been completed or not; and a circuit for selecting one of the rows by utilizing the information stored in the memory cells B. The memory circuit is configured to: write, upon completion of writing into the memory cells A of a given one of the rows, information indicative of the completion of the writing into the memory cells A of the given one of the rows, into the memory cell B for storing the information on the writing into the memory cells A of the given one of the rows, so that, by utilizing a change in the information stored in the memory cell B of the given one of the rows, the given one of the rows is switched from a selected state to a non-selected state, and another one of the rows, which is next to the given one of the rows, is switched from the non-selected state to the selected state to enable writing for the another one of the rows, the change being caused by the writing of the information indicative of the completion of the writing into the memory cells A of the given one of the rows has been completed; and repeat the writing, into the memory cells B of the rows to be written, the information indicative of the completion of the writing into the memory cells A of the rows to be written, to thereby sequentially select the rows to be written.

The above-mentioned memory circuit has an erroneous write prevention function utilizing the information stored in the memory cells B.

In the above-mentioned memory circuit, the memory cells B of neighboring rows are arranged in different columns.

In the above-mentioned memory circuit, a delay time period is provided between the change occurring in the information stored in the memory cell B and a change occurring in a row selection signal.

The above-mentioned memory circuit further includes a column decoder, the column decoder including an analog-digital converter.

In the above-mentioned memory circuit, the column decoder including the analog-digital converter has word lines extending therefrom, the word lines corresponding to an output of the column decoder, and each of the word lines is provided with one of a pull-up function and a pull-down function.

The above-mentioned memory circuit has a function of cutting off current flowing through the analog-digital converter.

The above-mentioned memory circuit further includes a latch circuit, and the above-mentioned memory circuit has: a function of causing the latch circuit to read and hold information from the memory cells A and information from the memory cells B; and a function of cutting off current flowing through the memory cells A and the memory cells B.

The above-mentioned memory circuit further includes a memory cell C that is provided before a first row of the memory cells A arranged in columns and rows, and the above-mentioned memory circuit controls whether to enable or disable writing into the memory cells A of the first row based on stored information of the memory cell C.

The above-mentioned memory circuit further includes a fuse capable of being electrically blown, as an element for storing information.

The above-mentioned memory circuit is provided on a semiconductor chip which requires a reference potential, and the analog-digital converter of the above-mentioned memory circuit has a reference potential used in common with the reference potential of the semiconductor chip.

According to the present invention described above, the reduction of the number of additional pads and the simplification of the additional circuit may be achieved, to thereby enable the reduction of the chip size.

BRIEF DESCRIPTION OF THE DRAWINGS

In the accompanying drawings:

FIG. 10 is a table illustrating a relation between an input voltage of a Data terminal and an output level illustrated in FIG. 9.

DETAILED DESCRIPTION OF THE PREFERRED EMBODIMENTS

First Embodiment

Figure 1:
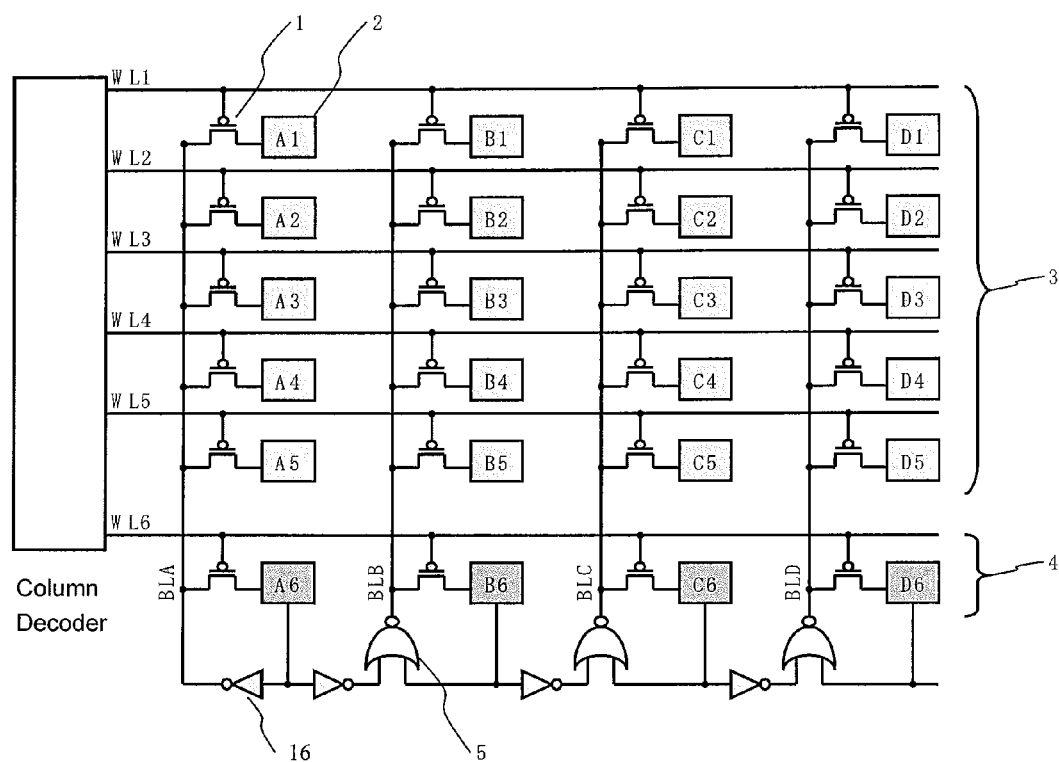
FIG. 1 is a circuit diagram of a trimming memory according to a first embodiment of the present invention.

Referring to FIG. 1, description is given of a case of a trimming memory circuit of 20 bits (5 columns by 4 rows). FIG. 1 is a circuit diagram of a trimming memory according to a first embodiment of the present invention.

Figure 4:
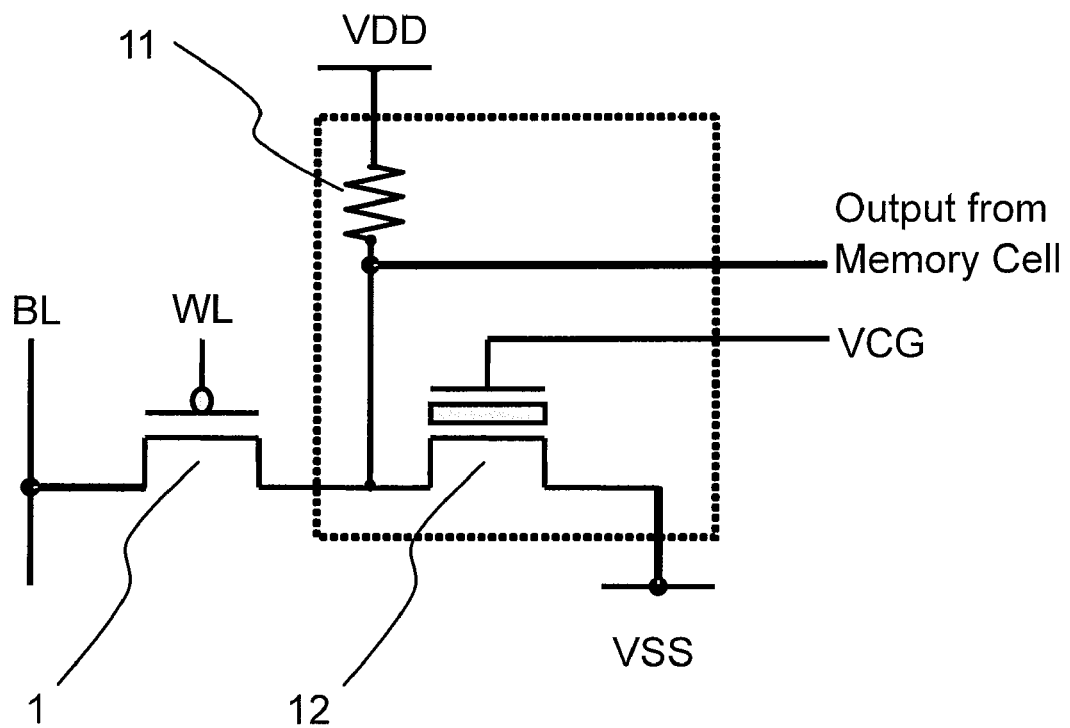
FIG. 4 is a circuit diagram of a memory cell that includes a memory element having a floating gate structure.

In the circuit diagram illustrated in FIG. 1, memory cells each of which is constituted by a P-channel transistor 1 and a memory main body 2 are arranged in a matrix. As illustrated in FIG. 4, each of the memory cells includes a memory element 12, a P-channel transistor 1, and a load resistor 11. First, the memory element 12 is described. The memory element 12 is an N-type metal oxide semiconductor (MOS) transistor having a floating gate structure, and stores information by accumulating electrons into its floating gate. Injection of electrons into the floating gate may be performed by utilizing a Fowler-Nordheim (FN) tunnel current or hot carriers, and such an operation is called "writing". Further, the electrons accumulated into the floating gate may be pulled out from the floating gate through irradiation of ultraviolet rays, and such an operation is called "erasing".

Figure 5:
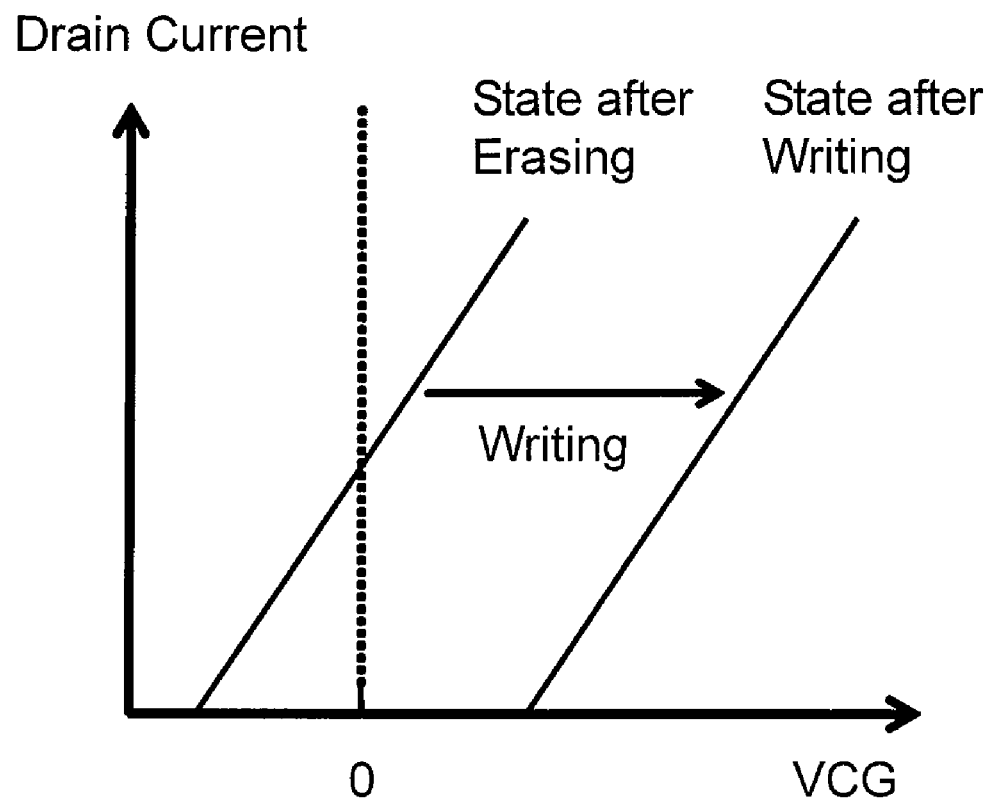
FIG. 5 is a graph illustrating a relation between a control gate voltage and a drain current of the memory element having the floating gate structure.

The floating gate is provided with a control gate for controlling the floating gate by means of capacitive coupling. FIG. 5 is a graph illustrating a relation between a control gate voltage and a drain current. In a state after writing, electrons are accumulated into the floating gate, and accordingly a channel becomes less likely to be inverted. In other words, Vth (threshold) is set higher than that in a state after erasing. The description has been given of a standard operation of a memory element which uses the N-type MOS transistor having the floating gate structure.

FIG. 4 is a circuit diagram of a memory cell which includes the memory element having the floating gate structure described above. The P-channel transistor 1 is provided between a drain of the memory element and a bit line (BL), and writing is controlled by turning ON/OFF the P-channel transistor 1. The load resistor 11 is provided between the drain of the memory element and a power supply line VDD. The load resistor 11 is set so as to have a resistance substantially intermediate between a source-drain resistance of the memory element at the time of writing and a source-drain resistance thereof at the time of erasing. With this setting, an output of the storage element becomes "1" (Hi) in the state after writing, and becomes "0" (Lo) in the state after erasing.

A dotted line frame illustrated in FIG. 4 corresponds to each of the memory main bodies 2 illustrated in the circuit diagram of the trimming memory according to the first embodiment of the present invention illustrated in FIG. 1. Each of the P-channel transistors 1 illustrated in FIG. 1 is identical with the P-channel transistor 1 illustrated in FIG. 4.

The configuration of the memory cell has been described above, which is, however, merely an example. The present invention mainly relates to a selection circuit, and hence any configuration may be employed for the memory cell.

In FIG. 1, each wiring line extending in a horizontal direction is used for selecting a column, and is referred to as word line (WL). In the columns, a first column is represented by WL1, a second column is represented by WL2, and the rest follows the same. Each wiring line extending in a vertical direction is used for selecting a row, and is referred to as bit line (BL). In the rows, a first row is represented by BLA, a second row is represented by BLB, and the rest follows the same. A circuit for supplying a signal for selecting each column is referred to as column decoder. Six word lines (number of columns of 5+1) extend from the column decoder.

The memory cells that are connected to the word lines WL1 to WL5 are referred to as trimming memory cells 3. Memory cells of A6, B6, C6, and D6, which are connected to the word line WL6, are referred to as BL control memory cells 4.

In FIG. 1, illustration of extraction of trimming stored information is omitted. However, when each output from the memory cells illustrated in FIG. 4 is input to each gate of transistors 10 illustrated in FIG. 3, the memory cells may be utilized for trimming employing resistive division.

Next, operations of the trimming memory are described. First, the chip is irradiated with ultraviolet rays so that all of the memory elements may become a state after erasing. When all of the memory elements are in the state after erasing, each output of the BL control memory cells is "0", and hence respective levels of the bit lines satisfy "BLA=1", "BLB=0", "BLC=0", and "BLD=0". On this occasion, upon supply of a signal selecting a column on the word line, only the PMOS transistor of the relevant column in the row of A is turned ON, to thereby perform writing into the relevant memory element. For example, when writing is to be performed into only the memory elements of the second column and the third column in the row of A, "(WL1, WL2, WL3, WL4, WL5)=(1, 0, 0, 1, 1)" is set, to thereby perform the writing into the memory cells of A2 and A3. Alternatively, the writing into the memory cells of A2 and A3 is separately performed in two steps, that is, by setting "(WL1, WL2, WL3, WL4, WL5)=(1, 0, 1, 1, 1)" and "(WL1, WL2, WL3, WL4, WL5)=(1, 1, 0, 1, 1)".

When the writing for the row of A is completed, writing is subsequently performed into the memory cell of A6 by setting "WL6=0". After the writing into the memory cell of A6, the respective levels of the bit lines are changed to satisfy "BLA=0", "BLB=1", "BLC=0", and "BLD=0", and accordingly only the row of B is switched to a writable state.

On this occasion, similarly to the case of the row of A, the word lines WL1, WL2, WL3, WL4, and WL5 are controlled to perform writing for the row of B. When the writing for the row of B is completed, writing is performed into the memory cell of B6. After the writing into the memory cell of B6, only the row of C is subsequently switched to a writable state. In this manner, rows may be sequentially selected to an infinite number.

The case of 20 bits (5 columns by 4 rows) has been described above, but no limitation is placed on the number of columns and the number of rows. The "column" and the "row", which have been used in the above description, are defined merely for the sake of convenience, and hence no essential change occurs if the "column" and the "row" are replaced with each other to be defined. The matrix arrangement has been described in terms of circuit, and thus has no relation with the arrangement of the memory elements on the chip. The gist of the present invention resides in that each row is provided with the BL control memory cell for storing information indicative of whether writing for the row has been finished or not, to thereby sequentially selecting the rows based on the information stored in the BL control memory cells. A circuit including NOR circuits 5 and inverter circuits 16 illustrated in FIG. 1 is merely an example of realizing such a function as described above, and the present invention is not limited to the circuit illustrated in FIG. 1.

Figure 6:
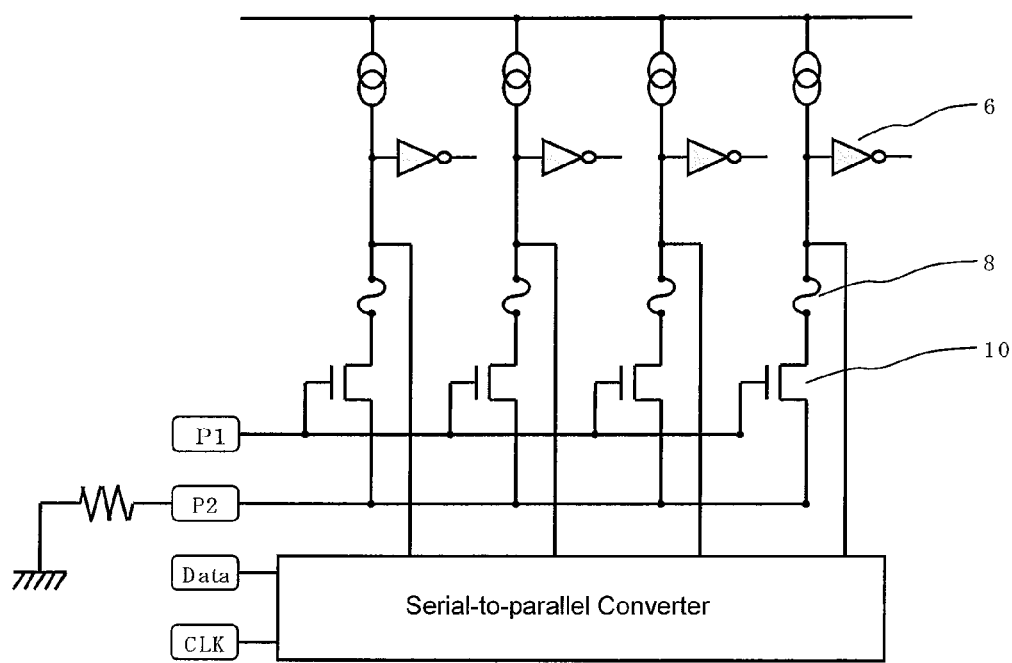
FIG. 6 is a circuit diagram of a memory according to a conventional technology.
Figure 7:
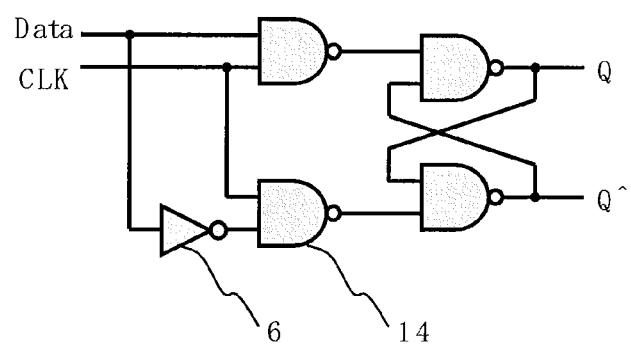
FIG. 7 is a circuit diagram of a D-type flip-flop (also called D-type latch)

In the conventional example illustrated in FIG. 6, a serial-to-parallel converter needs to be provided for the selection. The conventional example employs fuses each of which may be electrically blown by application of voltage potential P1 to turn on transistors 10 thus applying voltage potential P2 to the fuses, but a selection method therefor is basically identical with a selection method in the case of employing the memory elements. In many cases, the serial-to-parallel converter includes such D-type flip-flops (DFF) as illustrated in FIG. 7. The D-type flip-flop is also called D-type latch. Basically, one DFF is required for each row. As illustrated in FIG. 7, the DFF includes four NANDs 14 and an inverter 6. In other words, the DFF generally includes eighteen transistors. Compared to the case where the eighteen transistors are required for each row, the row selection method of the present invention requires a smaller number of transistors, and thus it is understood that a simplified circuit may be achieved.

Second Embodiment

According to the trimming memory circuit illustrated in FIG. 1, as has been described in the first embodiment, the writing is performed while sequentially selecting the rows, and then, upon the finish of writing into all of target memory elements, information indicative of the completion of the writing is written into the BL control memory element of the last row. After that time, none of the rows may be selected, to thereby disable writing therefor.

In order to prevent unintended writing after being trimmed, a trimming circuit employing memory elements is normally provided with an erroneous write prevention function. The circuit disclosed in JP 2003-110029 A is also provided with an erroneous write prevention function.

According to the present invention, owing to the BL control memory elements, which are used for sequentially selecting the rows, each row is enabled to be switched to a write-disabled state. The sequential-selection of the rows has been finished by the last row, and hence, in view of the purpose of selecting a row, no BL control memory element is required for the last row. However, if the BL control memory element is provided for the last row as well, and then the last row is switched to a write-disabled state by writing into this BL control memory element, writing becomes disabled for all of the memory elements. With this configuration, the erroneous write prevention function may be provided.

Third Embodiment

Figure 8:
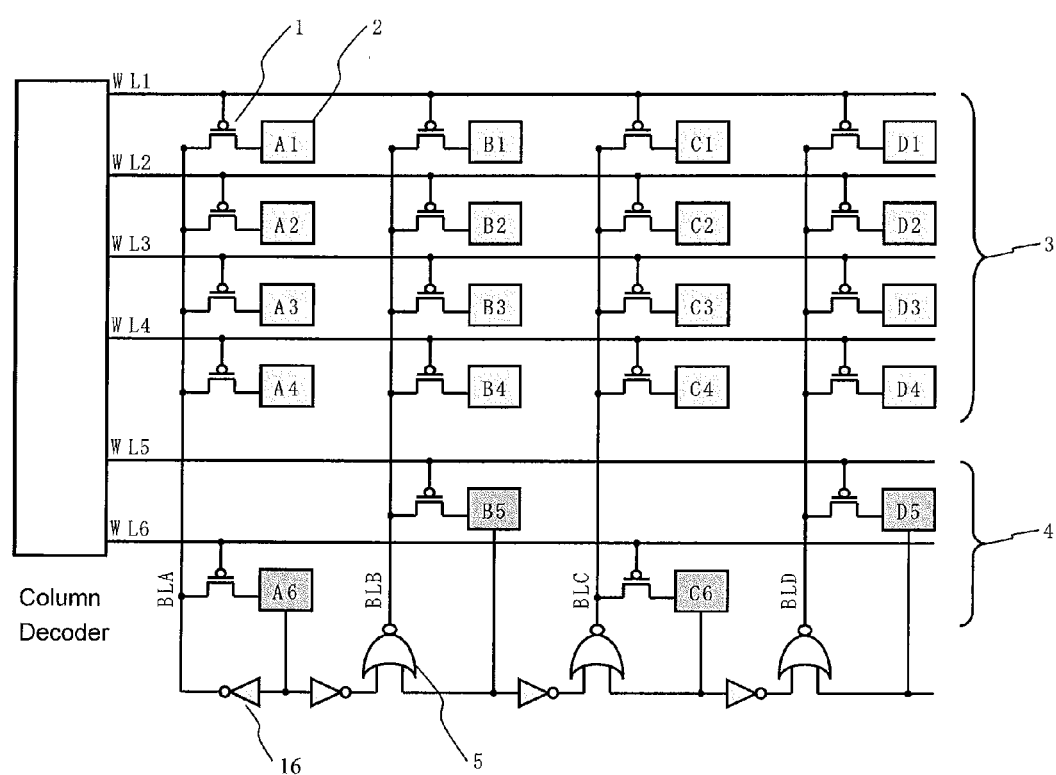
FIG. 8 is a circuit diagram of a trimming memory according to a third embodiment of the present invention.

Referring to FIG. 8, description is given of a case of a trimming memory circuit of 16 bits (4 columns by 4 rows). Six word lines (number of columns of 4+2) extend from the column decoder. Memory cells that are connected to the word lines WL1 to WL4 correspond to the trimming memory cells 3, and memory cells of A6, B5, C6, and D5, which are connected to the word lines WL5 and WL6, correspond to the BL control memory cells 4. The third embodiment is different from the first embodiment illustrated in FIG. 1 in that the BL control memory cells 4 are arranged across two columns rather than in one column, and that the BL control memory cells 4 of neighboring rows are arranged in different columns, that is, the BL control memory cells 4 are alternately arranged in different columns.

Description is given of an effect obtained in the case where the BL control memory cells are alternately arranged across the two columns as illustrated in FIG. 8. As illustrated in FIG. 1 of the first embodiment, in the case where the BL control memory cells are arranged in the same column (WL6), the writing into the memory cell of B6 starts at the same time when the writing into the memory cell of A6 has finished, and the writing into the memory cell of C6 starts at the same time when the writing into the memory cell of B6 has finished. Accordingly, a signal of the word line WL6 needs to be pulled down to "0" at the same time when the writing into the memory cell of A6 has finished. This timing should not be too early or too late. It is possible to control the timing, which involves, however, difficulty. Thus, the BL control memory cells 4 are alternately arranged across the two columns as described above.

In the case where the BL control memory cells 4 are alternately arranged across the two columns, writing is performed into the BL control memory cell of A6 upon the finish of writing into the trimming memory cells of the row of A, and even when the BL control memory cell of A6 remains to be applied with a write voltage after the writing into the BL control memory cell of A6 has been finished, no writing is performed into other memory cells. As described above, no writing is performed into the BL control memory cell of the row of B. Accordingly, the timing for writing may be easily adjusted, resulting in an effect that stable writing may be performed.

There is no particular reason to provide "two" columns in this embodiment as long as the BL control memory cells of neighboring rows are arranged in different columns. In this embodiment, the two columns are prepared, which are the smallest number of rows required for the BL control memory cells of neighboring rows to be arranged in different columns. Instead, there may be provided three or more columns.

Fourth Embodiment

Referring to FIG. 1, upon the finish of the writing into the trimming memory cells of the row of A, writing is subsequently performed into the BL control memory cell of A6 by setting "WL6=0". After the writing into the BL control memory cell of A6, the respective levels of the bit lines are changed to satisfy "BLA=0", "BLB=1", "BLC=0", and "BLD=0", and accordingly the row of A is switched to a write-disabled state while the row of B is switched to a writable state. The row of C and subsequent rows remain in a write-disabled state without change. With this configuration, no problem occurs in terms of operation, but there may occur a problem that writing cannot be performed to a sufficient depth of the BL control memory cell of A6 if the bit line of the row of A becomes a non-selected state at the same time when the output of the BL control memory cell of A6 is switched over.

Thus, a certain degree of delay is provided between the timing of the output from the BL control memory cell and the timing at which the signal of the bit line is switched over. A delay time period only needs to be long enough to cover a write time period necessary for performing writing to a sufficient depth of the BL control memory cell. The delay may be realized easily by means of resistors or the like.

With this configuration, the writing to a sufficient depth of the BL control memory cell may be more stably performed. As a result, the probability of a write failure or such a failure as data corruption may be reduced as well.

Fifth Embodiment

Description is given of a configuration of the column decoder. The row selection circuit may be simplified as described above, and hence a chip area may be reduced even in the case of using the conventional column decoder. However, when a technology described below is used in combination, a greater effect may be obtained.

Figure 9:
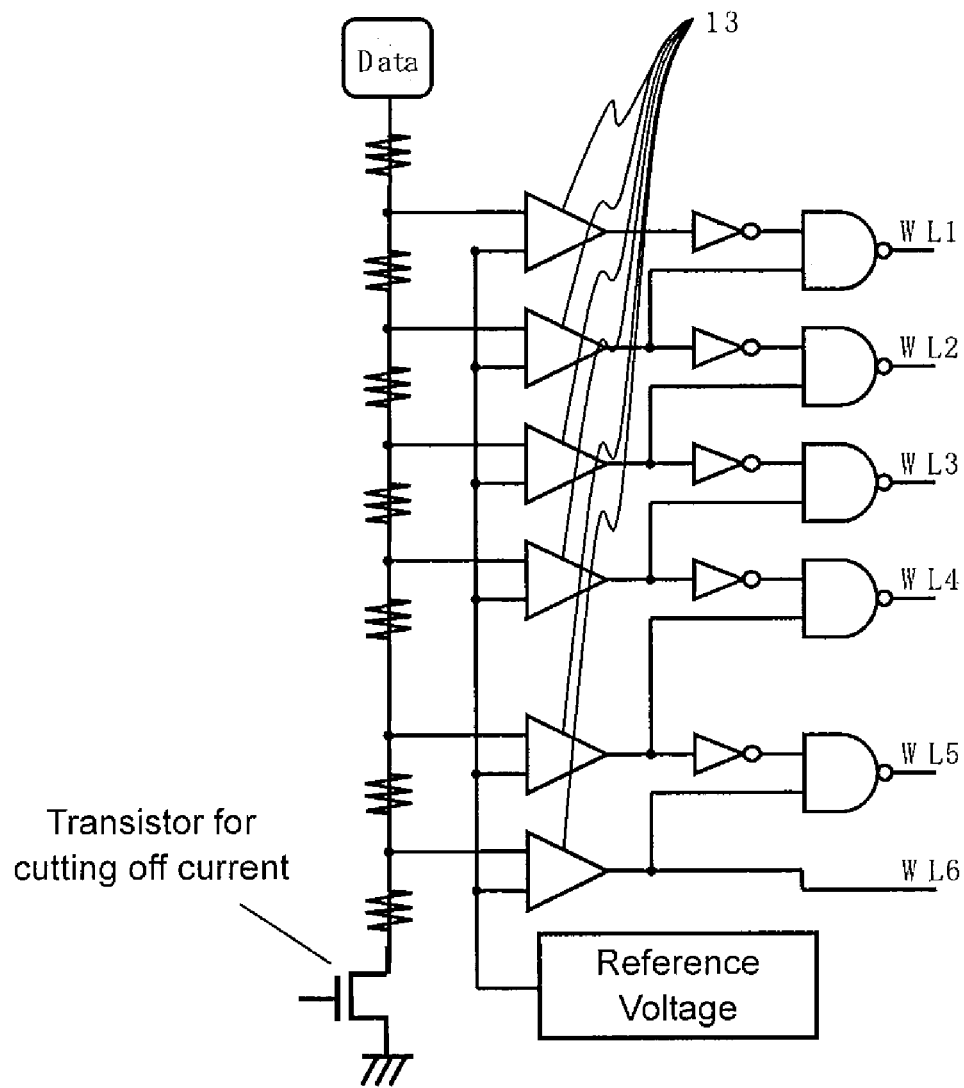
FIG. 9 is a circuit diagram of a column decoder employing analog-digital conversion.

FIG. 9 illustrates the configuration of the column decoder. An external terminal to which information for selecting a column is input is referred to as Data terminal. The circuit illustrated in FIG. 9 controls each signal of the word lines WL based on a potential of the Data terminal, and is implemented as a column decoder to which a circuit generally called an analog-digital converter is applied.

Resistors are provided between the Data terminal and the ground VSS, and respective appropriately-divided potentials are compared with a reference potential, to thereby control the signals. The appropriate dividing is described later. The reason why analog quantity is used as the input signal as described above is that it has an advantage that an arbitrary column may be selected with one terminal.

If the same configuration is to be achieved by means of a digital signal, at least two external terminals need to be prepared. For example, even when such serial data as a clock signal is to be converted into parallel data, the parallel data is merely a signal selecting all columns one by one in order, and hence at least one more external terminal needs to be prepared for selecting an arbitrary column. By using analog quantity as the input signal as described above, the number of external terminals may be reduced.

However, in general, there is a disadvantage as well. That is, in the above-mentioned case of the two terminals for digital signal, no limitation is placed on the selectable number of columns, whereas in the case of one terminal for analog signal, the selectable number of columns is limited depending on a resolution in analog-to-digital conversion. When the resolution is increased to increase the selectable number of bits, a scale of the analog-digital converter is increased or the like, resulting in no advantage of the reduction of area. Accordingly, as long as the advantage cannot be obtained, the analog system has not been put into practical use because an analog signal needs to be carefully dealt with compared to a digital signal.

In the case of the present invention, however, an analog signal is used only for selecting the word lines WL, and hence no limitation regarding an analog signal is placed on the selection of the bit lines BL. According to the present invention, despite that one terminal for analog signal is provided, the selectable number of bit lines is not limited without the need to increase the resolution of the analog-digital converter. As described above, it is only when the trimming memory circuit, to which the above-mentioned row selection method is applied, and the column decoder circuit illustrated in FIG. 9 are used in combination, that there may be obtained an effect that the number of external terminals required for the selection may be reduced to one without the limitation on the selectable number of bits and without the need to achieve high resolution.

Next, FIG. 10 illustrates an example of a relation between a potential of the Data terminal and the signals of the word lines WL1 to WL6. In this example, the reference potential is set to 1.0 V. The reference potential varies depending on fluctuations caused during a manufacturing step, but the variations fall in the range of about .+−.0.1V. Thus, respective resistance ratios of resistances between the Data terminal and the ground VSS are set so that each signal is switched over between when a voltage of 1.15 V or more is input to a corresponding comparator (element 13 in FIG. 9) and when a voltage of 0.85 V or less is input thereto. In this example, the resistance ratio may be determined by the following expression.

"resistance ratio=(resistance between a column and VSS)/(total resistance)"

In the case where the respective resistance ratios are set so as to satisfy "1st column: 0.869", "2nd column: 0.642", "3rd column: 0 475", "4th column: 0.351", "5th column: 0.259", and "6th column: 0.192", when the voltage input to the Data terminal is set to one illustrated in the left column of FIG. 10, corresponding outputs of NAND circuits illustrated in the right column of FIG. 10, that is, corresponding signals of the word lines are obtained.

In the following, actual operations are described by way of examples. For example, in the case of the voltage input to the Data terminal is 0.98 V or lower, the outputs of the NOR circuits are set to satisfy "(1st column, 2nd column, . , 6th colunnn)=(1, 1, 1, 1, 1, 1)". In the case of the voltage input to the Data terminal is 1.32 V, the outputs of the NAND circuits are set to satisfy "(1st column, 2nd column, . . . , 6th column)= ( 0,1,1,1,1,1)". In the case of the voltage input to the Data terminal is 1.79 V, the outputs of the NAND circuits are set to satisfy "(1st column, 2nd column, . . . , 6th column)=(1,0,1, 1,1,1)". As described above, an arbitrary column may be selected depending on the voltage of the Data terminal.

The setting of the resistance ratios depends on each of the reference potential, variations in the reference potential, fluctuations in dividing resistors, precision of a device for writing trimming data, and required speed. Thus, the resistance ratios are set in accordance with such conditions as described above. In addition, the number of columns is also adjusted in accordance with such conditions as described above.

In such a system as described above, the switching-over of the outputs takes time because the resistances are utilized. Accordingly, there is a risk that an unintended column may be selected while the voltage of the Data terminal is being switched. Thus, the word lines WL may desirably be pulled up to VDD in advance. In this example, the respective levels of the word lines WL are set to become "0" at the time of being selected, and thus the word lines WL are pulled up to VDD. However, in the case where the circuit has a system in which the respective levels of the word lines WL are set to become "1" at the time of being selected, the word lines WL are pulled down to VSS.

The circuit described in this example is merely an example of the case where the column decoder is formed of the analog-digital converter, and hence the decoder circuit is not limited to the system described above. Besides, a system of the analog-digital converter is not limited to the system described above as well.

With the configuration described above, the trimming circuit in which the number of additional pads is reduced to one, the trimming circuit in which the selection circuit is simplified compared to the conventional technologies, and the trimming circuit which includes the memory elements of arbitrary bits, may be obtained.

Sixth Embodiment

The analog-digital converter which has been used in the fifth embodiment does not function when no current is supplied thereto. However, the function of the analog-digital converter is required only during write operation. Accordingly, by providing a switch on a path through which current flows so that the current is allowed to flow therethrough only when necessary, current consumption may be suppressed. A transistor may be used as the switch.

There may be a case where the memory cell illustrated in FIG. 4 is continuously supplied with current. For example, while the memory element 12 is turned ON, a steady current determined by an ON-state resistance of the memory element 12 and a resistance of the load resistor 11 flows between the power sources. In order to suppress the steady current, there may be employed a method in which output data from the memory cell is saved in a circuit such as a latch, which has significantly low current consumption, and after the saving, the current flowing through the memory cell is cut off. The amount of current consumed while the latch circuit saves the information is substantially equal to the amount of leakage current flowing while transistors forming the latch are turned OFF, which is significantly small.

The memory cell illustrated in FIG. 4 is supplied with the current drawn from the power supply line VDD. Alternatively, there is another method in which the memory cell is connected not to the power supply line VDD but to an additionally-provided power supply line, and a potential of the additionally-provided power supply line is decreased to thereby suppress the current consumption. This method may be applied also to the analog-digital converter.

Seventh Embodiment

In each of the trimming memory circuits illustrated in FIG. 1 and FIG. 8, there is employed another configuration in which a BL control memory cell is added before the row of A, and the bit line of BLA is not allowed to become a selected state unless writing into this BL control memory cell has been performed, whereas the bit line of BLA becomes a selected state when writing into this BL control memory cell has been performed. With this configuration, writing into the entire memory circuit is disabled unless writing is performed into the BL control memory cell provided before the row of A.

In the trimming memory circuit, there is a fear that erroneous writing may occur due to external disturbance even before trimming information is written. With the system of the present invention, there may be obtained a function of preventing the erroneous writing.

In the method involving cutting off the current path, which has been described in the previous embodiment, there is employed a configuration in which a transistor is provided on the way of the current path so as to function to be turned ON to allow current supply when writing has been performed into the BL control memory cell provided before the row of A and to be turned OFF to cut off the current path when writing has been finished into the memory cells of the last row. This configuration is one method of suppressing current consumption at times other than writing.

In each of the trimming memory circuits of the present invention illustrated in FIG. 1 and FIG. 8, the BL control memory cell storing information indicative of completion of writing for the row of A directly controls the row of A and the row of B. Accordingly, even in the case where the BL control memory cell for storing the information indicative of completion of writing for the row of A is not disposed in the row of A unlike in the previous embodiments but disposed in the row of B, the circuit may remain to have substantially the same scale. Such arrangement enables the following configuration. That is, disposed in the row of A is the BL control memory cell for disabling writing for the row of A and subsequent rows unless the above-mentioned write completion information has been written into this BL control memory cell, whereas disposed in the row of B is the BL control memory cell for storing information indicative of whether writing into the trimming memory cells of the row of A has been completed or not. Subsequent rows may be controlled in the same manner.

Eighth Embodiment

In the embodiments described above, the description has been given of the case of employing a non-volatile memory element having the floating gate structure as illustrated in FIGS. 4 and 5. However, the present invention relates to a write method and an erroneous write prevention method, and hence is not limited to the system employing the memory element. The effect of the present invention may be obtained even in the case where a fuse capable of being electrically blown, which has been described not to be regarded as a memory element in the description of the conventional examples, is employed instead of the memory element.

Further, the present invention may employ a memory element which is not non-volatile, that is, a memory element that is capable of storing information only while its power supply is turned ON, such as a static random access memory (SRAM). Note that, in this case, writing of information needs to be performed each time the power supply is turned ON.

Ninth Embodiment

In the embodiments described above, the description has been given of the case where the present invention is applied to the trimming memory circuit. However, the present invention relates to the write method and the erroneous write prevention method, and hence there is absolutely no need to limit the use of the present invention to the use in trimming. The present invention may also be applied to a memory circuit which is used for any other purpose than the trimming.

However, according to the present invention, complete random access cannot be made with regard to both of writing and reading, which limits the use of the present invention. The trimming described above is a most effective example of the use of the present invention.

Tenth Embodiment

Figure 2:
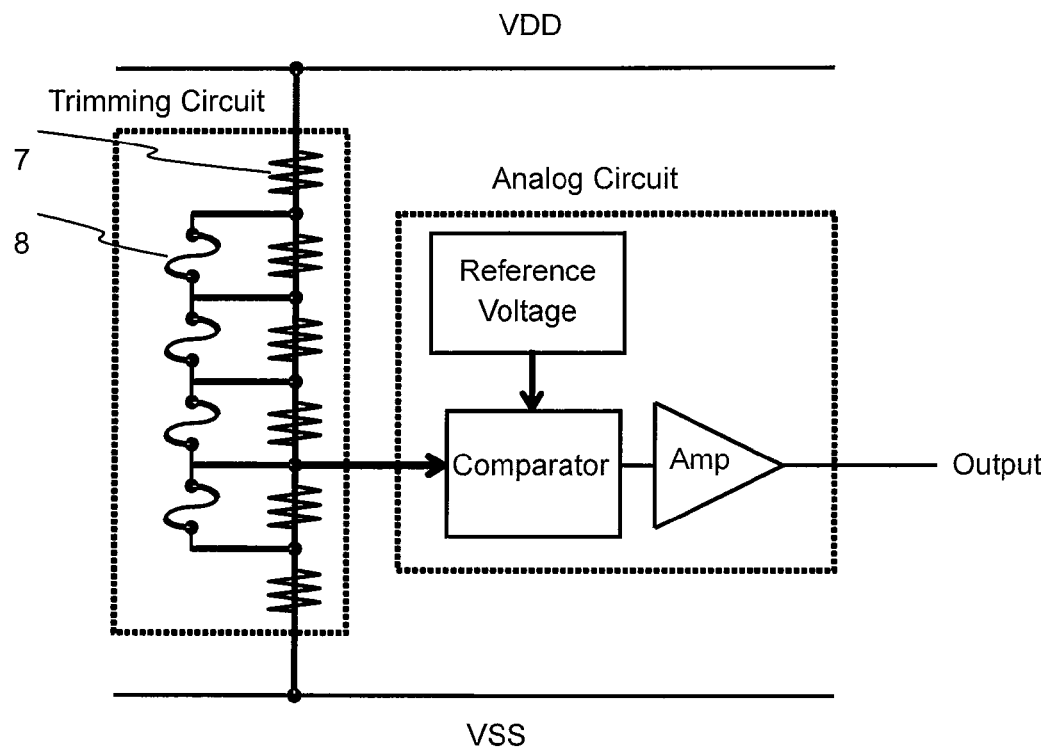
FIG. 2 is a schematic diagram of a voltage detector employing fuses.
Figure 3:
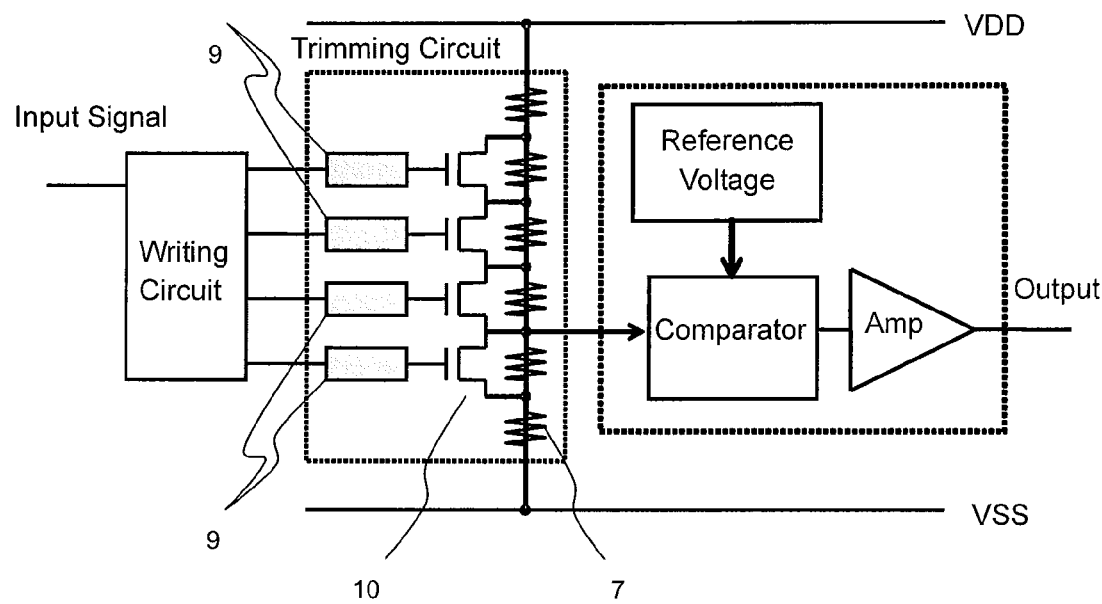
FIG. 3 is a schematic diagram of a voltage detector employing memory elements.

Both of the voltage detector illustrated in FIG. 2 or FIG. 3 and the column decoder employing the analog-digital conversion illustrated in FIG. 9 need a reference potential. When a circuit for generating the reference potential is used in common, the circuit area may be reduced.

What is claimed is:

1. A memory circuit for writing information into a memory cell selected by selecting a column and a row of the memory cell, the memory circuit comprising:
   memory cells A arranged in columns and rows;
   memory cells B for storing information indicative of whether writing into the memory cells A of the each of the rows has been completed or not, where an associated memory cell B is provided for each of the rows; and
   a logic circuit for selecting one of the rows of memory cells A by utilizing the information stored in one of the memory cells B,
   wherein the memory circuit is configured to:
   write the information indicative of a completion of a writing into a selected row of memory cells A into an associated memory cell B upon the completion of writing into the selected row of memory cells A by action of the logic circuit to send an output voltage change of the associated memory cell B to a bit line of the selected row and to a bit line of a second row of memory cells A, such that the selected row is switched from a selected state to a non-selected state, and the second row of memory cells A is switched from the non-selected state to the selected state to enable writing of the second row of memory cells A; and repeat writing into additional associated memory cells B to thereby sequentially select additional rows of memory cells A for writing information.

2. The memory circuit according to claim 1, wherein the memory circuit has an erroneous write prevention function utilizing the information stored in the memory cells B.

3. The memory circuit according to claim 1, wherein the additional associated memory cells B of neighboring rows are arranged in different columns and connected to a corresponding column by a bit-line connection.

4. The memory circuit according to claim 1, wherein a delay time period is provided between a change occurring in the information stored in the associated memory cell B and a change occurring in a row selection signal.

5. The memory circuit according to claim 1, further comprising a column decoder constituted from an analog-digital converter.

6. The memory circuit according to claim 5, wherein:
the column decoder comprising the analog-digital converter has word lines extending therefrom, the word lines corresponding to an output of the column decoder; and
each of the word lines is provided with one of a pull-up function and a pull-down function.

7. The memory circuit according to claim 5, further comprising a function of cutting off current flowing through the analog-digital converter.

8. The memory circuit according to claim 1, further comprising a latch circuit, wherein the memory circuit includes:
a function of causing the latch circuit to read and hold information from the memory cells A and information from the memory cells B; and
a function of cutting off current flowing through the memory cells A and the memory cells B.

9. The memory circuit according to claim 1, further comprising a memory cell C that is provided before a first row of the memory cells A, and wherein the memory circuit controls whether to enable or disable writing into the memory cells A of the first row based on stored information of the memory cell C.

10. The memory circuit according to claim 1, further comprising a fuse capable of being electrically blown, as an element for storing information.

11. The memory circuit according to claim 5, wherein the memory circuit is formed on a semiconductor chip having a circuit for generating a reference potential, and wherein the reference potential is used in common by the analog-digital converter.

12. The memory circuit according to claim 1, wherein the logic circuit comprises an NOR gate and an inverter coupled to the associated memory cell.

* * * * *